US005778970A

United States Patent [19]

Chang

[11] Patent Number: 5,778,970
[45] Date of Patent: Jul. 14, 1998

[54] HEAT DISSIPATION APPARATUS

[75] Inventor: Juei-Chi Chang, Taipei, Taiwan

[73] Assignee: Mitac International Corp., Hsinchu, Taiwan

[21] Appl. No.: 718,260

[22] Filed: Sep. 20, 1996

[30] Foreign Application Priority Data

Jul. 19, 1996 [TW] Taiwan .................................. 85211095

[51] Int. Cl.$^6$ .......................................................... F28F 7/00
[52] U.S. Cl. .................... 165/80.3; 361/690; 361/701; 165/903; 165/185
[58] Field of Search ........................ 165/80.3, 121, 165/185, 903; 174/16.3; 257/722; 361/691, 694, 692, 690, 701

[56] References Cited

U.S. PATENT DOCUMENTS

| 4,149,218 | 4/1979 | Carrubba et al. ................. 361/691 |
| 4,277,816 | 7/1981 | Dunn et al. ....................... 361/694 |
| 4,296,455 | 10/1981 | Leaycraft et al. ................. 361/691 |
| 4,674,004 | 6/1987 | Smith et al. ...................... 361/694 |
| 4,953,058 | 8/1990 | Harris .............................. 361/690 |
| 5,218,513 | 6/1993 | Brown ............................ 361/694 X |
| 5,535,094 | 7/1996 | Nelson et al. .................... 361/697 |

FOREIGN PATENT DOCUMENTS

| 3609037 | 10/1986 | Germany ........................ 165/80.3 |
| 58900 | 2/1990 | Japan ........................... 165/80.3 |

OTHER PUBLICATIONS

Hwang, U.P. et al. "Push–Pull Multi–Flow System For Air–Cooled Modules", IBM TDB, vol. 22, No. 2, Jul. 1979, pp. 696–697.

Primary Examiner—Leonard R. Leo
Attorney, Agent, or Firm—Birch, Stewart, Kolasch & Birch, LLP

[57] ABSTRACT

A heat dissipation apparatus for dissipating heat of a semiconductor chip module is disclosed. The heat dissipation apparatus includes a base, a plurality of fins, and a heat transfer pipe. The heat transfer pipe has a first opening and a second opening. The first opening is adjacent to the fins which are arranged over the base. The second opening is in a cooling ambient. The heat generated from the semiconductor chip module is conducted away by the base, the fins and then transferred into the cooling ambient through the heat transfer pipe.

14 Claims, 6 Drawing Sheets

HEAT DISSIPATION APPARATUS

BACKGROUND OF THE INVENTION

1. Field of the Invention

The present invention relates to a heat dissipation apparatus, and more specifically, to an apparatus for dissipating heat from a heat source to an external cooling ambient.

2. Description of Related Art

As a semiconductor chip module, such as the central processing unit (CPU) of a computer system, consumes more power and its dimension becomes smaller, the heat generated per unit area also increases. Since the heat degrades the performance of the semiconductor chip module, the heat dissipation efficiency has become an important issue in the designation of the chip module as well as the computer system which contains the chip module.

The heat generated from a semiconductor chip module can be removed by a heat sink. Referring to FIG. 1, a traditional heat sink which includes a base 10 and a plurality of fins 20 is in close contact with a semiconductor chip module 1. The base 10 is made of conductive material such as aluminum. A contact surface 12 of the base 10 can be attached to the semiconductor chip module through a silicon rubber pad 2 for conducting the heat away. The fins 20 are also made of conductive material and are arranged over the base 10 for dissipating the heat from the base 10 to the surrounding air.

The aforementioned heat dissipation structure has been widely employed in a personal computer system. For example, the CPU in each computer system has the heat sink placed thereon, as shown in FIG. 1. However, since the computer system has a case to protect its internal elements, the air convection between the interior and exterior of the computer system is strictly limited. That is, it is difficult to transfer the heat dissipated from the heat sink to the exterior of the computer system. Therefore, the temperature inside the computer system keeps increasing and the heat dissipation efficiency of the heat sink decreases. Thus, the performance of the CPU or other semiconductor chip module is affected.

SUMMARY OF THE INVENTION

Accordingly, the present innovation provides a heat dissipation apparatus for efficiently removing the heat generated from a heat source to a cooling ambient.

The heat dissipation apparatus of the present invention transfers the heat from a semiconductor chip module in a computer system to the surrounding air of the computer system, thereby increasing the heat dissipation efficiency.

The heat dissipation apparatus of the present invention includes a base, a plurality of fins, and a heat transfer pipe. The base has a contact surface which can be attached to a heat source to conduct heat away. The fins over the base dissipate the heat from the base to the surrounding air. The heat transfer pipe has a first opening and a second opening. The first opening is adjacent to the fins and the second opening is in a cooling ambient, thereby transferring the heat in the hot air around the fins to the cooling ambient.

The heat transfer pipe of the present invention can be connected to the base. Moreover, the present invention can provide a plurality of heat transfer pipes to increase the heat dissipation efficiency. The plurality of heat transfer pipes, which can be an assembly, are made of conductive material, such as aluminum.

In a preferred embodiment of the present invention, the heat source is a semiconductor chip module, such as a CPU in a computer system, and the cooling ambient is the air surrounding the computer system. When the temperature of the air around the fins increases due to heat dissipation of the base and the fins, the temperature difference between the first opening and the second opening increases. Therefore, the hot air near the first opening can be in convection with the cool air outside the computer system through the heat transfer pipe, thereby removing the heat inside the computer system. Moreover, since the heat transfer pipe is made of conductive material and can be connected to the base, the heat generated from the CPU can be dissipated to the exterior of the computer system by means of conductive transfer, thus further increasing the heat dissipation efficiency.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
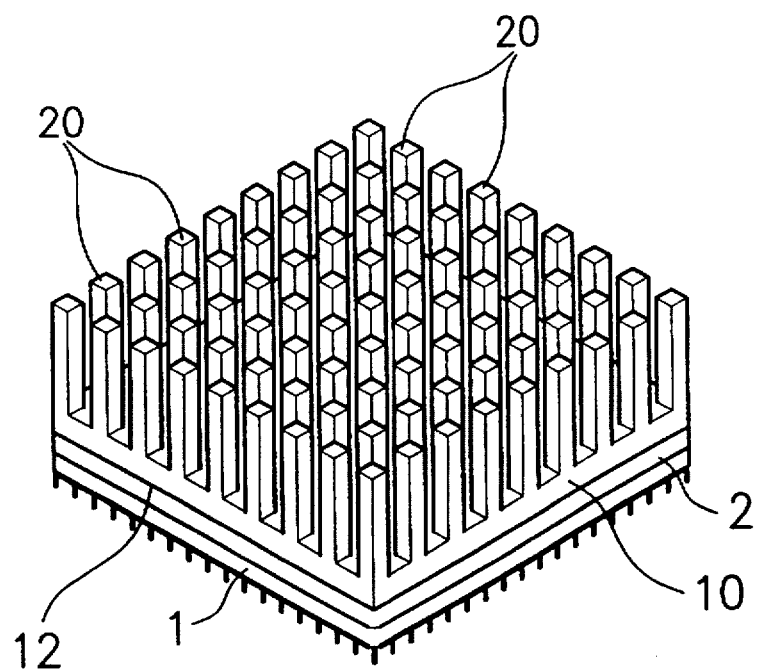
FIG. 1 is a schematic diagram illustrating a conventional heat dissipation structure.
Figure 2:
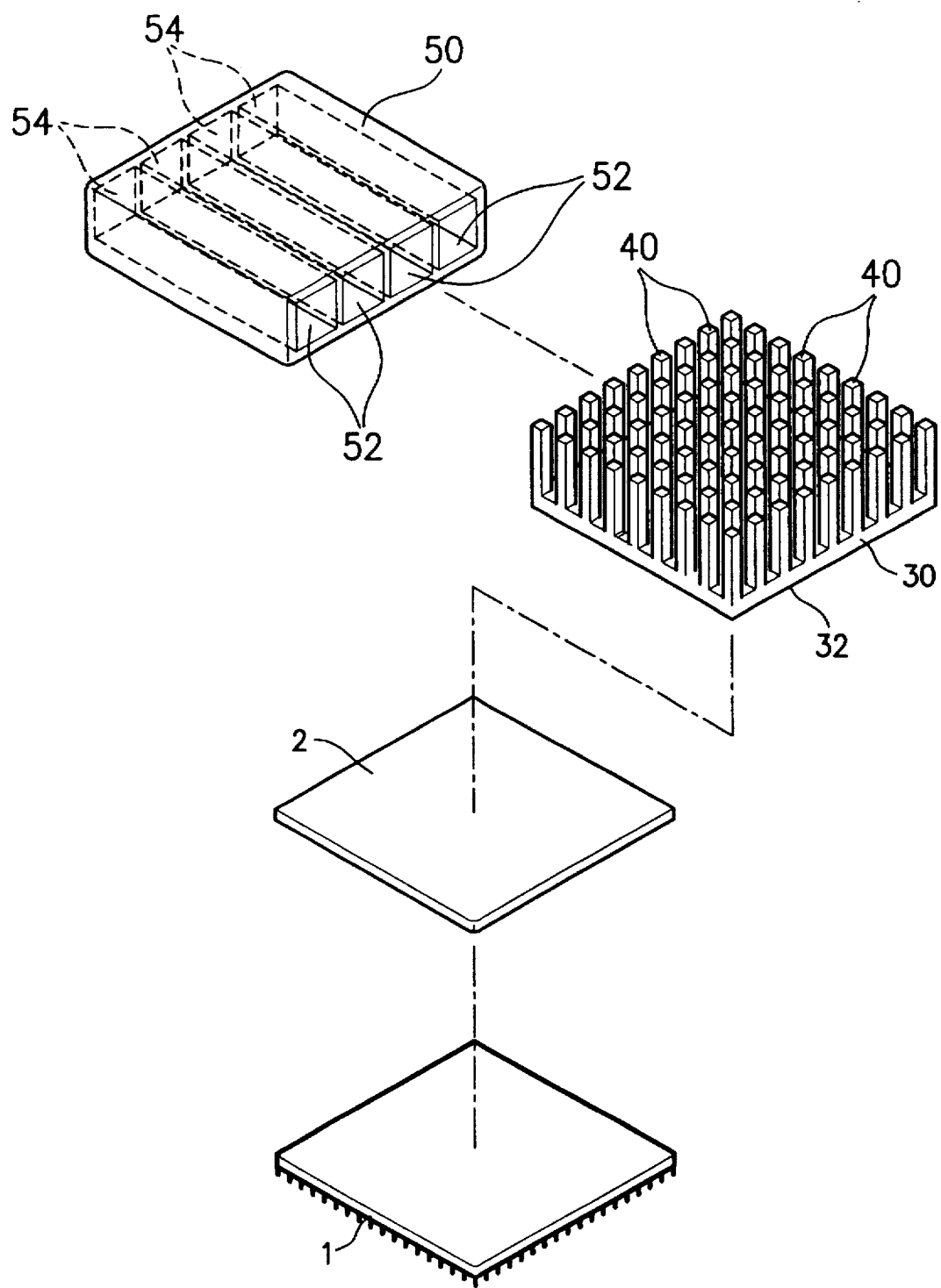
FIG. 2 illustrates each portion of the heat dissipation apparatus of the present invention including a semiconductor chip module.

Referring to FIG. 2, the heat dissipation apparatus according to the preferred embodiment of the present invention includes a base 30, a plurality of fins 40 and at least one heat transfer pipe 50. The heat dissipation apparatus of the present invention is provided for dissipating heat of a heat source, such as a semiconductor chip module 1, to a cooling ambient. In the present embodiment, the semiconductor chip module 1 is a CPU of a computer system and the cooling ambient is the surrounding air of the computer system.

The base 30 of the heat dissipation apparatus is made of conductive material, such as aluminum. It includes a contact surface 32 with which the heat dissipation apparatus can be in contact with the CPU 1. Moreover, a silicon rubber pad 2 can be provided between the contact surface 32 and the CPU 1 to improve the contact condition.

The fins 40 are also made of conductive material, for example, aluminum. They are arranged over the base 30 to dissipate the heat thereof. The fins 40 and the base 30 can be an assembly. When the CUP operates, the heat generated can be conducted away by means of the base 30 and the fins 40, thus increasing the temperature of the air around the fins 40.

The present invention provides the heat transfer pipe 50 between the fins 40 and the cooling ambient. The heat transfer pipe 50 has a first opening 52 and a second opening 54. The first opening 52 is adjacent to the fins and the second opening 54 is in the cooling ambient, that is, the second opening 54 is in the exterior of the computer system. Since the air temperature near the first opening 52 is higher than that near the second opening 54, the hot air surrounding the fins will have convection with the cold air in the exterior of the computer system through the heat transfer pipe 50. Therefore, the heat generated from the CPU can be efficiently removed.

The present invention can utilize more than one heat transfer pipe 50 to remove the heat inside the computer system. These heat transfer pipes can be arranged in parallel or in an assembly. For example, the present embodiment has four pipes connected in parallel. Moreover, as these pipes can be made of conductive material, when they contact with the base 30, the heat can be dissipated directly through the pipes by means of conductive transfer. This effect can be enhanced if the heat transfer pipes 50 and the base 30 are made of the same material at the same time.

Figure 3:
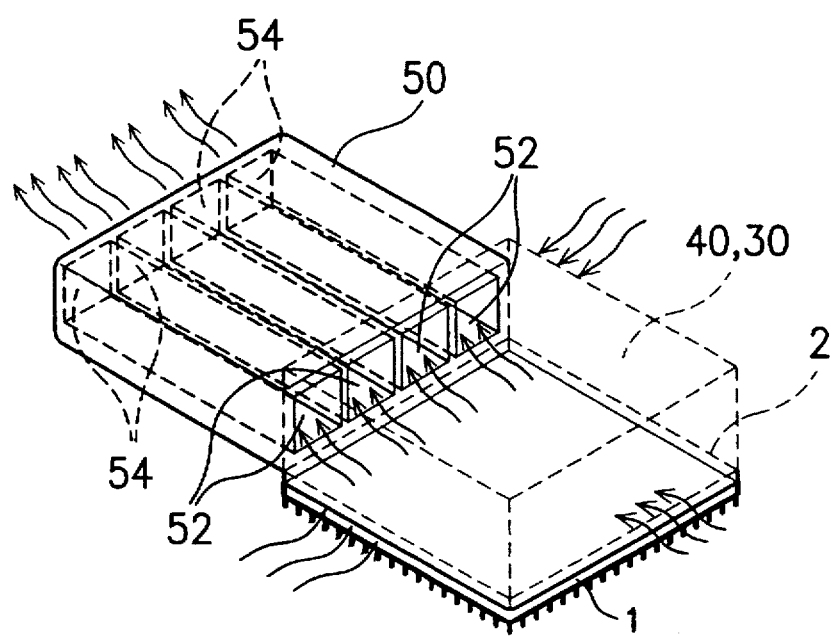
FIG. 3 is a schematic diagram illustrating the heat transfer process in the heat dissipation apparatus of the present invention.

The convection between the hot air near the heat source and the cold air of the cooling ambient is schematically illustrated in FIG. 3. According to the heat convection equation: $q=Ar\Delta T$, wherein q is the heat convection amount per unit time, A is the convection area, r is the conductive coefficient, and $\Delta T$ is the temperature difference between the two openings 52 and 54, whenever a temperature difference exists between the two openings 52 and 54, heat convection occurs naturally. Therefore, the heat dissipation efficiency increases in the present embodiment.

Several experiments are carried out to examine the influence of the heat dissipation apparatus on the heat dissipation effect of the CPU in a computer system. The results are illustrated in FIG. 4 through FIG. 8.

Figure 4:
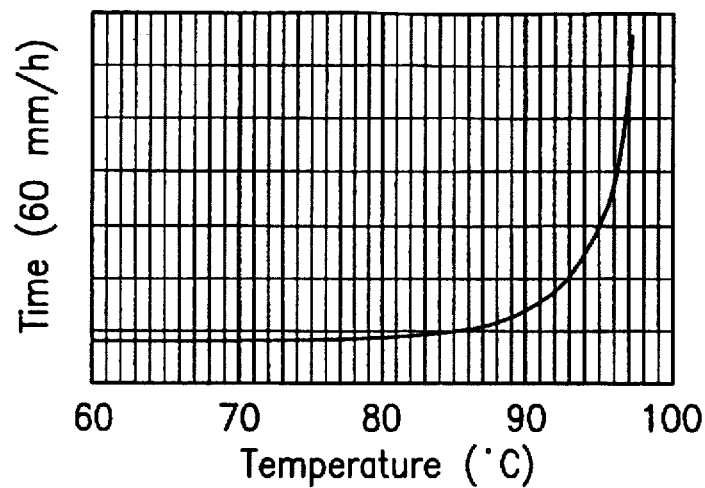
FIG. 4 illustrates the heat dissipation effect of a CPU without any heat dissipation apparatus.

I. The temperature variation of an operating CPU without any heat dissipation apparatus is continuously recorded to observe its heat dissipation effect. As shown in FIG. 4, a saturation temperature of about 97° C. is achieved.

Figure 5:
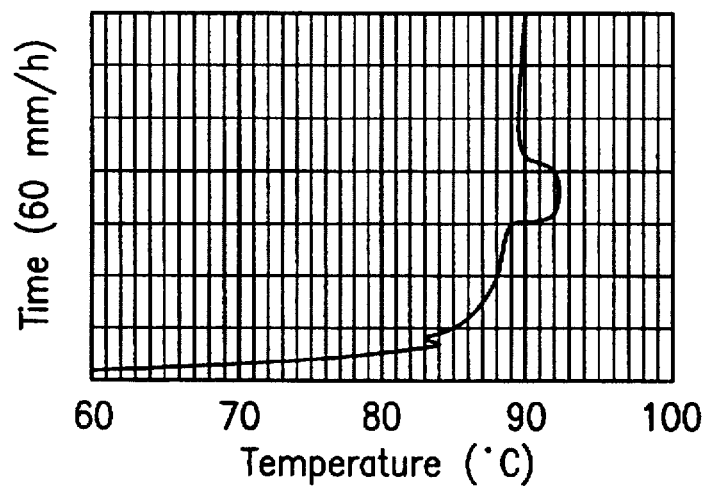
FIG. 5 illustrates the heat dissipation effect of a CPU in accompaniment with a heat transfer pipe which does not contact the CPU.

II. Referring to FIG. 5, the temperature of an operating CPU with a heat transfer pipe nearby (without contacting the CPU) reaches a saturation value of about 90° C.

Figure 6:
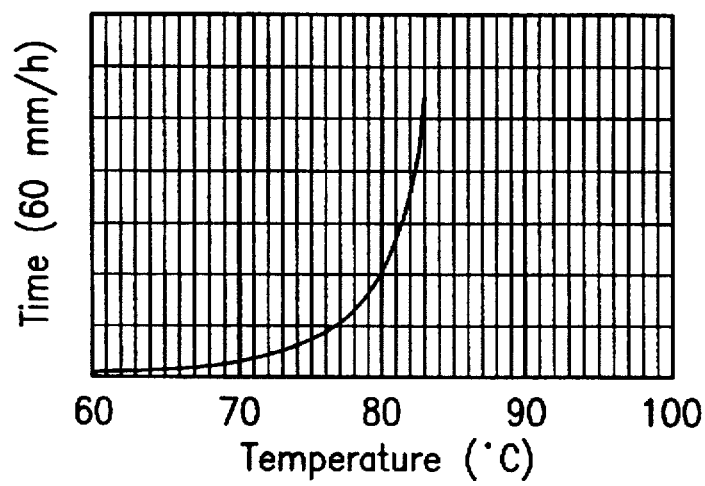
FIG. 6 illustrates the heat dissipation effect of a CPU with a heat transfer pipe which contacts the CPU.

III. FIG. 6 illustrates the heat dissipation effect of an operating CPU which is in contact with a heat transfer pipe. The saturation temperature is about 83° C.

Figure 7:
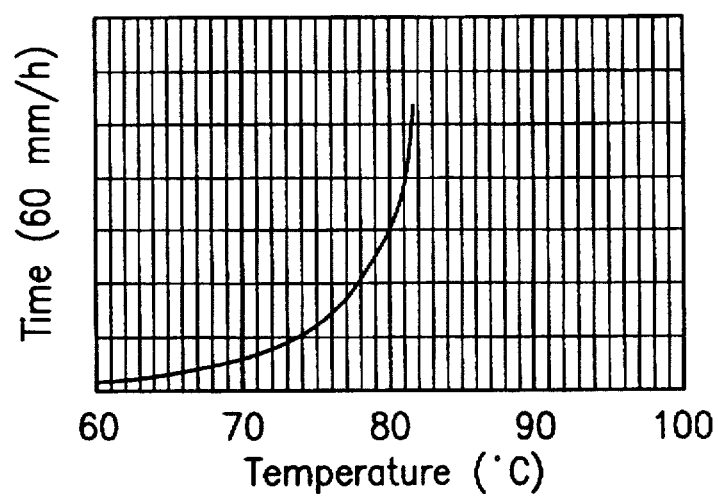
FIG. 7 illustrates the dissipation effect of a CPU with the heat dissipation apparatus in which the heat transfer pipe does not contact the base.

IV. The heat dissipation apparatus of the present invention is attached to a CPU, but the heat transfer pipe does not contact the base. The heat dissipation effect is illustrated in FIG. 7. As shown in the figure, a saturation temperature of about 82° C. is achieved.

Figure 8:
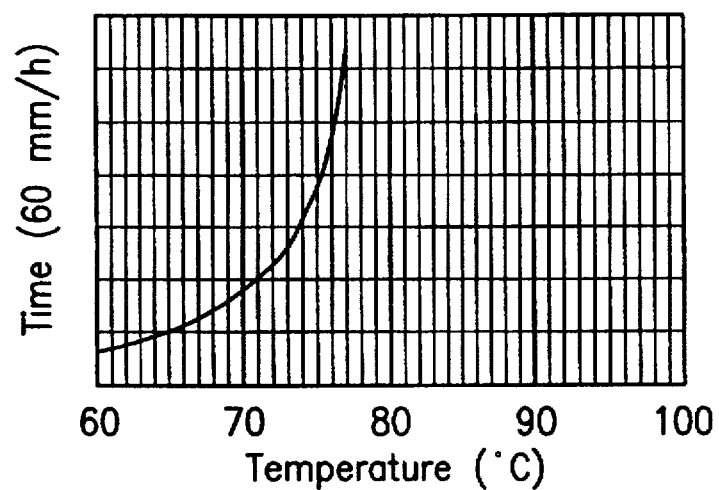
FIG. 8 illustrates the dissipation effect of a CPU with the heat dissipation apparatus in which the heat transfer pipe is connected to the base.

V. The complete heat dissipation apparatus in which the heat transfer pipe is connected to the base is utilized to remove heat of an operating CPU. The temperature is continuously recorded as shown in FIG. 8. Referring to the figure, a saturation temperature of about 77° C. is achieved.

In the above experiments, the CPU utilizing the heat dissipation apparatus of the present invention has the lowest saturation temperature. The improvement in heat dissipation effect due to the heat transfer pipe is also proved through the experiments.

Figure 9:
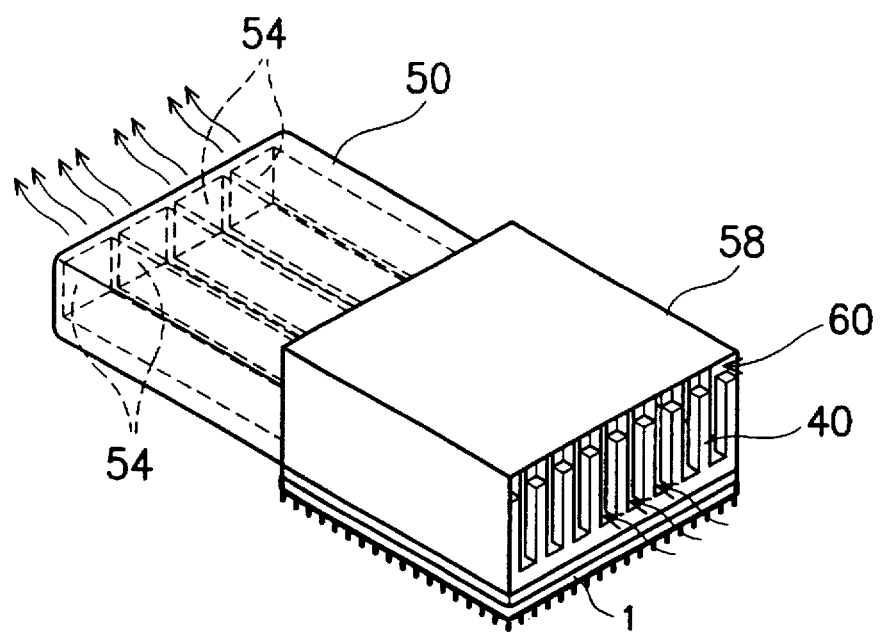
FIG. 9 illustrates another embodiment of the present invention.

In order to regulate the hot air flow, a cover can be provided over the base of the heat dissipation apparatus. Referring to FIG. 9, the cover 58 is formed over the base 30. The cover 58 includes a pair of plates at opposite sides of the base 30 and a plate over the fins. Therefore, the heat of the fins 40 can be removed by air flow from opening 60 to the cooling ambient through the heat transfer pipes. Though the cover 58 illustrated in FIG. 9 is separated from the heat transfer pipes 50, it can be an extension portion of the heat transfer pipes 50, thereby collecting most of the heat near the fins 40 and dissipating the heat to the cooling ambient.

The invention being thus described, it will be obvious that the same may be varied in many ways. Such variations are not to be regarded as a departure from the spirit and scope of the invention, and all such modifications as would be obvious to one skilled in the art were intended to be included within the scope of the following claims.

What is claimed is:

1. A heat dissipation apparatus for dissipating heat from a heat source to a cooling ambient, comprising:

base having a contact surface attachable to said heat source;

a plurality of fins on said base; and means for transferring heat by convection from the heat source to the cooling ambient, the means including a heat transfer pipe, the heat transfer pipe having a first opening and a second opening, said first opening being laterally adjacent to said fins, and said second opening being in said cooling ambient whereby the heat transfer pipe transfers heat from the heat source to the cooling ambient by convection without using forced air.

2. The heat dissipation apparatus as claimed in claim 1, wherein said heat transfer pipe is connected to said base.

3. The heat dissipation apparatus as claimed in claim 1, wherein said heat transfer pipe is made of conductive material.

4. The heat dissipation apparatus as claimed in claim 1 further comprising a plurality of heat transfer pipes between said fins and said cooling ambient.

5. The heat dissipation apparatus as claimed in claim 4, wherein said heat transfer pipes are connected to the base.

6. The heat dissipation apparatus as claimed in claim 5, wherein said heat transfer pipes are made of conductive material.

7. The heat dissipation apparatus as claimed in claim 6, wherein said conductive material is aluminum.

8. The heat dissipation apparatus as claimed in claim 1, wherein said heat source is a semiconductor chip module.

9. The heat dissipation apparatus as claimed in claim 1, wherein said heat source is a central processing unit (CPU).

10. The heat dissipation apparatus as claimed in claim 1, wherein said cooling ambient is the air.

11. A heat dissipation apparatus for dissipating heat from a heat source to a cooling ambient, comprising:

a base having a contact surface attachable to said heat source;

a plurality of fins on said base;

means for transferring heat by convection from the heat source to the cooling ambient, the means including a heat transfer pipe, the heat transfer pipe having a first opening and a second opening, said first opening being laterally adjacent to said fins, and said second opening being in said cooling ambient whereby the heat transfer pipe transfers heat from the heat source to the cooling ambient by convection without using forced air; and a cover over said base.

12. The heat dissipation apparatus as claimed in claim 11, wherein said heat source is a semiconductor chip module.

13. The heat dissipation apparatus as claimed in claim 11, wherein said cover includes a plate at one side of said base.

14. The heat dissipation apparatus as claimed in claim 11, wherein said cover includes a plate over said fins.

\* \* \* \* \*